(12) United States Patent
Zhang

(10) Patent No.: US 9,645,432 B2
(45) Date of Patent: May 9, 2017

(54) TOUCH DISPLAY DEVICES

(71) Applicant: Shenzhen China Star Optoelectronics Technology Co., Ltd., Shenzhen, Guangdong (CN)

(72) Inventor: Yanxue Zhang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 296 days.

(21) Appl. No.: 14/423,105

(22) PCT Filed: Jan. 12, 2015

(86) PCT No.: PCT/CN2015/070544
§ 371 (c)(1),
(2) Date: Feb. 20, 2015

(87) PCT Pub. No.: WO2016/101358
PCT Pub. Date: Jun. 30, 2016

(65) Prior Publication Data
US 2016/0341999 A1 Nov. 24, 2016

(30) Foreign Application Priority Data
Dec. 26, 2014 (CN) .......................... 2014 1 0829590

(51) Int. Cl.
*G02F 1/1333* (2006.01)
*G06F 3/041* (2006.01)
*F21V 8/00* (2006.01)
*G02F 1/1335* (2006.01)
*H01L 51/52* (2006.01)
*H01L 27/32* (2006.01)

(52) U.S. Cl.
CPC ......... *G02F 1/13338* (2013.01); *G02B 6/005* (2013.01); *G02B 6/0088* (2013.01); *G02F 1/1333* (2013.01); *G02F 1/133528* (2013.01); *G06F 3/041* (2013.01); *G06F 3/0412* (2013.01); *H01L 51/524* (2013.01); *H01L 51/5246* (2013.01); *G02F 2202/28* (2013.01); *G06F 2203/04103* (2013.01); *H01L 27/323* (2013.01)

(58) Field of Classification Search
CPC ............................ G02F 1/1333; G02F 1/1335
See application file for complete search history.

(56) References Cited

U.S. PATENT DOCUMENTS

| 8,951,085 B2 * | 2/2015 | Yeo ....................... G02F 1/1333 428/40.1 |
| 2014/0290841 A1 * | 10/2014 | Tsai .................... H01L 27/1266 156/247 |

* cited by examiner

*Primary Examiner* — Timothy L Rude
(74) *Attorney, Agent, or Firm* — Andrew C. Cheng

(57) ABSTRACT

A touch display device including a display module and a cover arranged above the display module is disclosed. The cover includes a plate body and a side plate extending from lateral ends of the plate body toward the display module. The side plate of the cover is bonded with the display module. A vacuum is formed between the cover and the display module. The side plate is formed in a rim of the plate body of the cover. The lateral surfaces of the side plate are bonded with the lateral surfaces of the display module to form the vacuum between the cover and the display module. As such, it is not needed to use the transparent optical glue between the cover and the display module. The display module is prevented from being damaged when the touch display device needs rework or repair, which contributes to the rework or repair.

12 Claims, 2 Drawing Sheets

TOUCH DISPLAY DEVICES

BACKGROUND OF THE INVENTION

1. Field of the Invention

The present disclosure relates to touch display technology, and more particularly to a touch display device.

2. Discussion of the Related Art

Touch panels are input devices on which users may use fingers or object to select images shown on the display devices by contacting the display devices so as to input instructions. As such, the touch panels may replace the independent input devices, such as keyboards or mouse connecting to the display devices, and thus have been widely adopted. Currently, the touch panels may be incorporate in electronic devices, such as mobile phones and pads.

Usually, the touch panels include a cover, a touch panel, and a display panel, such as a liquid crystal panel. The touch panels may be OGS, In-Cell touch panel, and On-cell panel in accordance with its configuration. For the above touch panels, the plate-like cover are bonded with the display panel, such as adopting transparent optical glue to bond the cover and the display panel. However, when the touch panel needed to be rework or repaired, the display panels may be damaged, which results in great difficulties for rework or repair.

SUMMARY

In one aspect, a touch display device includes: a display module and a cover arranged above the display module, the cover includes a plate body and a side plate extending from lateral ends of the plate body toward the display module, the side plate of the cover is bonded with the display module, and a vacuum is formed between the cover and the display module.

Wherein the touch display device further includes a touch panel bonded with a down surface of the cover.

Wherein the display module includes a back plate and OLED display panel being arranged above the back plate, the cover is arranged above the OLED display panel, lateral surfaces of the OLED display panel and of the back plate are both bonded with the side plate of the cover, and the vacuum is formed between the cover and the OLED display panel.

Wherein the display module includes a back plate and OLED display panel being arranged above the back plate, the cover is arranged above the OLED display panel, lateral surfaces of the OLED display panel and of the back plate are both bonded with the side plate of the cover, and the vacuum is formed between the cover and the OLED display panel.

Wherein the lateral surfaces of the OLED display panel and of the back plate are both bonded with the side plate of the cover via transparent optical glue.

Wherein the display module includes a liquid crystal panel and a backlight module, the liquid crystal panel is arranged above the backlight module, the cover is arranged above the liquid crystal panel, the lateral surfaces of the liquid crystal panel and of the backlight module are bonded with the side plate of the cover, and the vacuum is formed between the cover and the liquid crystal panel.

Wherein the liquid crystal panel comprises a first substrate, a second substrate, an up polarizer, and a down polarizer, the display modules further comprises a touch panel, the first substrate is arranged opposite to the second substrate, the down polarizer is bonded with a down surface of the second substrate, the touch panel is bonded with an up surface of the first substrate, and the up polarizer is bonded with the up surface of the touch panel.

Wherein the liquid crystal panel comprises a first substrate, a second substrate, an up polarizer, and a down polarizer, the display modules further comprises a touch panel, the first substrate is arranged opposite to the second substrate, the down polarizer is bonded with a down surface of the second substrate, the up polarizer is bonded with an up surface of the first substrate, and the touch panel is bonded with a down surface of the touch panel.

Wherein the backlight module includes a back frame, a light guiding plate, and a plurality of optical films, the light guiding plate is arranged within the back frame, the optical films are arranged above the light guiding plate, the liquid crystal panel is arranged within the back frame and is above the optical films, and the lateral surfaces of the liquid crystal panel and of the back frame are both bonded with the side plate of the cover.

Wherein the lateral surfaces of the liquid crystal panel and of the back frame are both bonded with the side plate of the cover via transparent optical glue.

In view of the above, the side plate is formed in a rim of the plate body of the cover. The lateral surfaces of the side plate are bonded with the lateral surfaces of the display module to form the vacuum between the cover and the display module. As such, it is not needed to use the transparent optical glue between the cover and the display module. The display module is prevented from being damaged when the touch display device needs rework or repair, which contributes to the rework or repair.

DETAILED DESCRIPTION OF THE EMBODIMENTS

Figure 1:
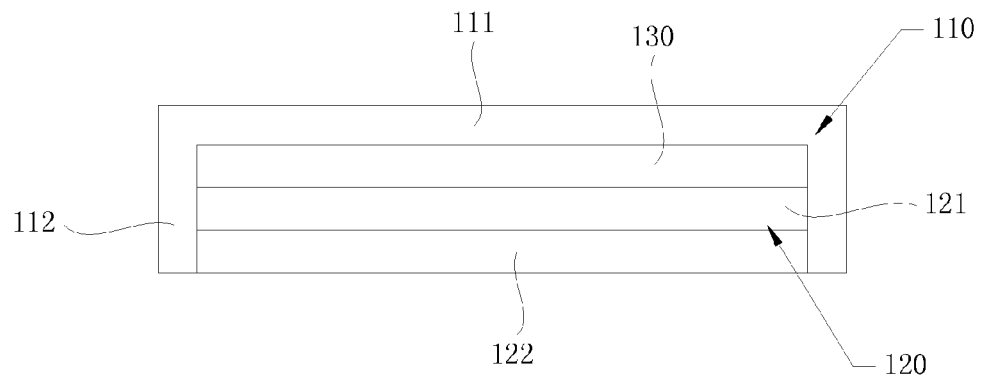
FIG. 1 is a schematic view of the touch display device in accordance with a first embodiment.

Embodiments of the invention will now be described more fully hereinafter with reference to the accompanying drawings, in which embodiments of the invention are shown.

Various example embodiments will now be described more fully with reference to the accompanying drawings in which some example embodiments are shown. In the drawings, the thicknesses of layers and regions may be exaggerated for clarity. In the following description, in order to avoid the known structure and/or function unnecessary detailed description of the concept of the invention result in confusion, well-known structures may be omitted and/or functions described in unnecessary detail.

FIG. 1 is a schematic view of the touch display device in accordance with a first embodiment. The touch device includes a cover 110, a display module 120, and a touch panel 130.

In one embodiment, the cover 110 is arranged above the display module 120. The touch panel 130 is bonded with a down surface of the cover 110. The cover 110 includes a plate body 111 and a side plate 112 extending from lateral ends of the plate body 111 toward the display module 120.

That is, the cover 110 is formed by the plate body 111 and the side plate 112, and the side plate 112 surrounding the plate body 111. The side plate 112 of the cover 110 is bonded with the lateral surfaces of the display module 120. In addition, a vacuum is formed between the plate body 111 of the cover 110 and the display module 120. It can be understood that the vacuum may be formed between the plate body 111 and the display module 120, or the plate body 111 of the cover 110 may be closely contacted with the display module 120.

In this way, the side plate 112 is formed in a rim of the plate body 111 of the cover 110, and the side plate 112 is bonded with the lateral surfaces of the display module 120. In addition, the vacuum is formed between the plate body 111 of the cover 110 and the display module 120, and thus it is not needed to use the transparent optical glue between the plate body 111 of the cover 110 and the display module 120. In the first embodiment, when the touch display device has to be rework or repair, the display module 120 is prevented from being damaged, which contributes to the rework or repair.

In addition, the display module 120 includes a back plate 121 and OLED display panel 122. The OLED display panel 122 is arranged above the back plate 121. The cover 110 is arranged above the OLED display panel 122. The lateral surfaces of the OLED display panel 122 and of the back plate 121 are both bonded with the side plate 112 of the cover 110. The vacuum is formed between the plate body 111 of the cover 110 and the OLED display panel 122. Further, the lateral surfaces of the OLED display panel 122 and of the back plate 121 are both bonded with the side plate 112 of the cover 110 via transparent optical glue, such as OCA or OCR.

In an example, the cover 110 may be formed by, but not limited to, the transparent glass material.

Figure 2:
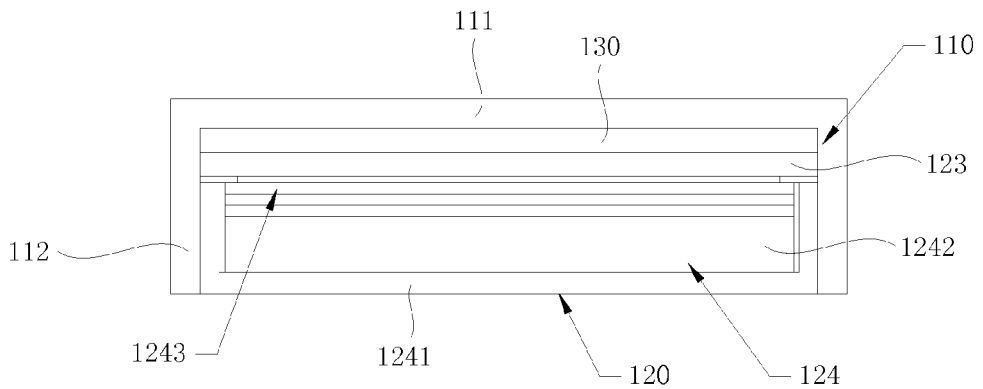
FIG. 2 is a schematic view of the touch display device in accordance with a second embodiment.

FIG. 2 is a schematic view of the touch display device in accordance with a second embodiment. The touch device includes a cover 110, a display module 120, and a touch panel 130.

In one embodiment, the cover 110 is arranged above the display module 120. The touch panel 130 is bonded on a down surface of the cover 110. The cover 110 includes a plate body 111 and a side plate 112 extending from lateral ends of the plate body 111 toward the display module 120. That is, the cover 110 is formed by the plate body 111 and the side plate 112, and the side plate 112 surrounding the plate body 111. The side plate 112 of the cover 110 is bonded with the lateral surfaces of the display module 120. In addition, a vacuum is formed between the plate body 111 of the cover 110 and the display module 120. It can be understood that the vacuum may be formed between the plate body 111 and the display module 120, or the plate body 111 of the cover 110 may be closely contacted with the display module 120.

In this way, the side plate 112 is formed in a rim of the plate body 111 of the cover 110, and the side plate 112 is bonded with the lateral surfaces of the display module 120. In addition, the vacuum is formed between the plate body 111 of the cover 110 and the display module 120, and thus it is not needed to use the transparent optical glue between the plate body 111 of the cover 110 and the display module 120. In the second embodiment, when the touch display device has to be rework or repair, the display module 120 is prevented from being damaged, which contributes to the rework or repair.

In addition, the display module 120 includes a liquid crystal panel 123 and a backlight module 124. The liquid crystal panel 123 is arranged above the backlight module 124. The cover 110 is arranged above the liquid crystal panel 123. The lateral surfaces of the liquid crystal panel 123 and of the backlight module 124 are bonded with the side plate 112 of the cover 110. The vacuum is formed between the cover 110 and the liquid crystal panel 123. It can be understood that the concrete structure of the liquid crystal panel 123 may be reference to the current technology.

The backlight module 124 includes a back frame 1241, a light guiding plate 1242, and a plurality of optical films 1243. The light guiding plate 1242 is arranged within the back frame 1241. The optical films 1243 are arranged above the light guiding plate 1242. The liquid crystal panel 123 is arranged within the back frame 1241 and are above the optical films 1243. The lateral surfaces of the liquid crystal panel 123 and of the back frame 1241 are both bonded with the side plate 112 of the cover 110. In the second embodiment, the lateral surfaces of the backlight module 124 are the lateral surfaces of the back frame 1241. It can be understood that the backlight module 124 further includes other optical components, which may be referred to current technology.

Further, the lateral surfaces of the liquid crystal panel 123 and of the back frame 1241 are both bonded with the side plate 112 of the cover 110 via transparent optical glue, such as OCA or OCR.

In an example, the cover 110 may be formed by, but not limited to, the transparent glass material.

Figure 3:
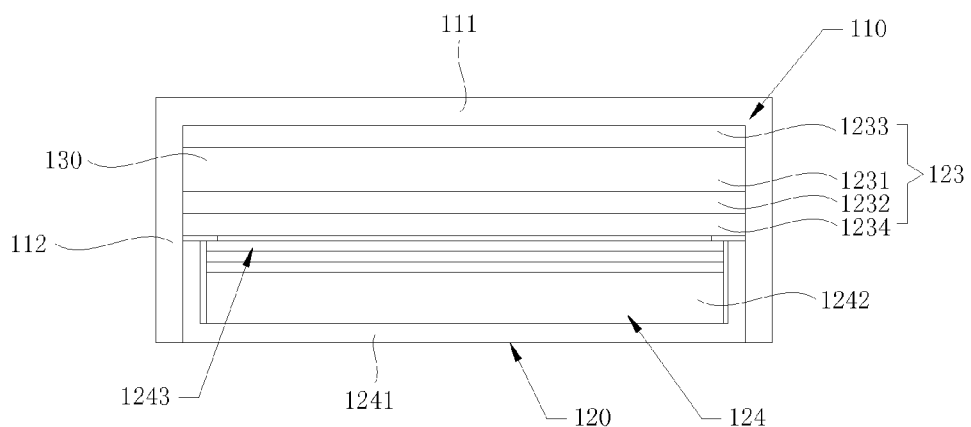
FIG. 3 is a schematic view of the touch display device in accordance with a third embodiment.

FIG. 3 is a schematic view of the touch display device in accordance with a third embodiment. The touch device includes a cover 110, a display module 120, and a touch panel 130.

In one embodiment, the cover 110 is arranged above the display module 120. The cover 110 includes a plate body 111 and a side plate 112 extending from lateral ends of the plate body 111 toward the display module 120. That is, the cover 110 is formed by the plate body 111 and the side plate 112, and the side plate 112 surrounding the plate body 111. The side plate 112 of the cover 110 is bonded with the lateral surfaces of the display module 120. In addition, a vacuum is formed between the plate body 111 of the cover 110 and the display module 120. It can be understood that the vacuum may be formed between the plate body 111 and the display module 120, or the plate body 111 of the cover 110 may be closely contacted with the display module 120.

In this way, the side plate 112 is formed in a rim of the plate body 111 of the cover 110, and the side plate 112 is bonded with the lateral surfaces of the display module 120. In addition, the vacuum is formed between the plate body 111 of the cover 110 and the display module 120, and thus it is not needed to use the transparent optical glue between the plate body 111 of the cover 110 and the display module 120. In the third embodiment, when the touch display device has to be rework or repair, the display module 120 is prevented from being damaged, which contributes to the rework or repair.

In addition, the display module 120 includes a liquid crystal panel 123 and a backlight module 124. The liquid crystal panel 123 is arranged above the backlight module 124. The cover 110 is arranged above the liquid crystal panel 123. The lateral surfaces of the liquid crystal panel 123 and of the backlight module 124 are bonded with the side plate 112 of the cover 110. The vacuum is formed between the 119

The liquid crystal panel 123 includes a first substrate 1231, a second substrate 1232, an up polarizer 1233, and a down polarizer 1234. The first substrate 1231 is arranged opposite to the second substrate 1232. The down polarizer 1234 is bonded with the down surface of the second substrate 1232. The touch panel 130 is bonded on the up surface of the first substrate 1231. The up polarizer 1233 is bonded with an up surface of the touch panel 130. It can be understood that the liquid crystal panel 123 further includes other optical components, which may be referred to current technology.

The backlight module 124 includes a back frame 1241, a light guiding plate 1242, and a plurality of optical films 1243. The light guiding plate 1242 is arranged within the back frame 1241. The optical films 1243 are arranged above the light guiding plate 1242. The liquid crystal panel 123 is arranged within the back frame 1241 and is above the optical films 1243. It can be understood that the backlight module 124 further includes other optical components, which may be referred to current technology.

The lateral surfaces of the liquid crystal panel 123 and of the back frame 1241 are both bonded with the side plate 112 of the cover 110. In the third embodiment, the lateral surfaces of the backlight module 124 are the lateral surfaces of the back frame 1241. The lateral surfaces of the liquid crystal panel 123 includes the lateral surface of the first substrate 1231, of the second substrate 1232, of the up polarizer 1233, of the down polarizer 1234, and of the touch panel 130.

Further, the lateral surfaces of the liquid crystal panel 123 and of the back frame 1241 are both bonded with the side plate 112 of the cover 110 via transparent optical glue, such as OCA or OCR.

In an example, the cover 110 may be formed by, but not limited to, the transparent glass material.

Figure 4:
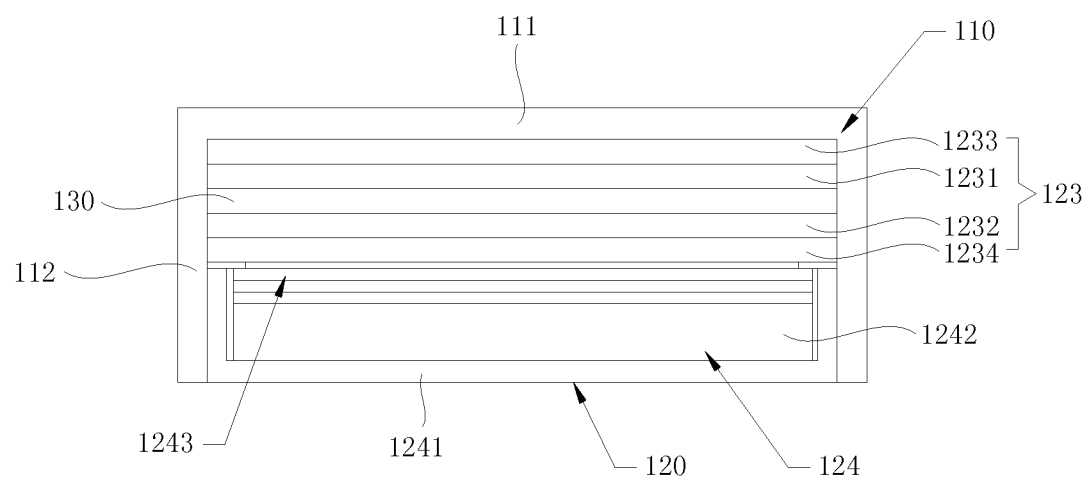
FIG. 4 is a schematic view of the touch display device in accordance with a fourth embodiment.

FIG. 4 is a schematic view of the touch display device in accordance with a fourth embodiment. The difference resides in the third and the fourth embodiments will be described hereinafter. The liquid crystal panel 123 includes a first substrate 1231, a second substrate 1232, an up polarizer 1233, and a down polarizer 1234. The first substrate 1231 is arranged opposite to the second substrate 1232. The down polarizer 1234 is bonded with the down surface of the second substrate 1232. The touch panel 130 is bonded on the down surface of the first substrate 1231. The up polarizer 1233 is bonded on the up surface of the touch panel 130. It can be understood that the liquid crystal panel 123 further includes other optical components, which may be referred to current technology.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A touch display device, comprising:
a display module and a cover arranged above the display module, the cover comprises a plate body and a side plate extending from lateral ends of the plate body toward the display module, the side plate of the cover is bonded with the display module, and a vacuum is formed between the cover and the display module.

2. The touch display device as claimed in claim 1, wherein the touch display device further comprises a touch panel bonded with a down surface of the cover.

3. The touch display device as claimed in claim 2, wherein the display module comprises a back plate and OLED display panel being arranged above the back plate, the cover is arranged above the OLED display panel, lateral surfaces of the OLED display panel and of the back plate are both bonded with the side plate of the cover, and the vacuum is formed between the cover and the OLED display panel.

4. The touch display device as claimed in claim 3, wherein the lateral surfaces of the OLED display panel and of the back plate are both bonded with the side plate of the cover via transparent optical glue.

5. The touch display device as claimed in claim 2, wherein the display module comprises a liquid crystal panel and a backlight module, the liquid crystal panel is arranged above the backlight module, the cover is arranged above the liquid crystal panel, the lateral surfaces of the liquid crystal panel and of the backlight module are bonded with the side plate of the cover, and the vacuum is formed between the cover and the liquid crystal panel.

6. The touch display device as claimed in claim 1, wherein the display module comprises a back plate and OLED display panel being arranged above the back plate, the cover is arranged above the OLED display panel, lateral surfaces of the OLED display panel and of the back plate are both bonded with the side plate of the cover, and the vacuum is formed between the cover and the OLED display panel.

7. The touch display device as claimed in claim 6, wherein the lateral surfaces of the OLED display panel and of the back plate are both bonded with the side plate of the cover via transparent optical glue.

8. The touch display device as claimed in claim 1, wherein the display module comprises a liquid crystal panel and a backlight module, the liquid crystal panel is arranged above the backlight module, the cover is arranged above the liquid crystal panel, the lateral surfaces of the liquid crystal panel and of the backlight module are bonded with the side plate of the cover, and the vacuum is formed between the cover and the liquid crystal panel.

9. The touch display device as claimed in claim 8, wherein the liquid crystal panel comprises a first substrate, a second substrate, an up polarizer, and a down polarizer, the display modules further comprises a touch panel, the first substrate is arranged opposite to the second substrate, the down polarizer is bonded with a down surface of the second substrate, the touch panel is bonded with an up surface of the first substrate, and the up polarizer is bonded with the up surface of the touch panel.

10. The touch display device as claimed in claim 8, wherein the liquid crystal panel comprises a first substrate, a second substrate, an up polarizer, and a down polarizer, the display modules further comprises a touch panel, the first substrate is arranged opposite to the second substrate, the down polarizer is bonded with a down surface of the second substrate, the up polarizer is bonded with an up surface of the first substrate, and the touch panel is bonded with a down surface of the touch panel.

11. The touch display device as claimed in claim 8, wherein the backlight module includes a back frame, a light guiding plate, and a plurality of optical films, the light guiding plate is arranged within the back frame, the optical films are arranged above the light guiding plate, the liquid crystal panel is arranged within the back frame and is above the optical films, and the lateral surfaces of the liquid crystal panel and of the back frame are both bonded with the side plate of the cover.

12. The touch display device as claimed in claim 11, wherein the lateral surfaces of the liquid crystal panel and of the back frame are both bonded with the side plate of the cover via transparent optical glue.

* * * * *